US011882712B2

(12) United States Patent
Nam et al.

(10) Patent No.: US 11,882,712 B2
(45) Date of Patent: Jan. 23, 2024

(54) QUANTUM DOT AND LIGHTING EMITTING DEVICE COMPRISING THE SAME

(71) Applicants: Samsung Display Co., Ltd., Yongin-si (KR); Research & Business Foundation SUNGKYUNKWAN UNIVERSITY, Suwon-si (KR)

(72) Inventors: Minki Nam, Incheon (KR); Sungwoon Kim, Hwaseong-si (KR); Yunhyuk Ko, Asan-si (KR); Wan Ki Bae, Suwon-si (KR); Sooho Lee, Hwaseong-si (KR); Byeong Guk Jeong, Suwon-si (KR); Yunku Jung, Cheonan-si (KR)

(73) Assignees: Samsung Display Co., Ltd., Yongin-si (KR); Research & Business Foundation Sungkyunkwan University, Suwon-si (KR)

( * ) Notice: Subject to any disclaimer, the term of this patent is extended or adjusted under 35 U.S.C. 154(b) by 329 days.

(21) Appl. No.: 17/171,893

(22) Filed: Feb. 9, 2021

(65) Prior Publication Data
US 2021/0257573 A1  Aug. 19, 2021

(30) Foreign Application Priority Data
Feb. 13, 2020 (KR) .................... 10-2020-0017912

(51) Int. Cl.
*H10K 50/115* (2023.01)
*C09K 11/88* (2006.01)
(Continued)

(52) U.S. Cl.
CPC ........ *H10K 50/115* (2023.02); *C09K 11/0883* (2013.01); *C09K 11/883* (2013.01); *B82Y 20/00* (2013.01); *B82Y 40/00* (2013.01)

(58) Field of Classification Search
CPC ............. H10K 50/115; C09K 11/0883; C09K 11/883; B82Y 20/00; B82Y 40/00
See application file for complete search history.

(56) References Cited

U.S. PATENT DOCUMENTS 6,322,901 B1  11/2001  Bawendi et al.
7,621,997 B2  11/2009  Jun et al.
(Continued)

FOREIGN PATENT DOCUMENTS

KR    10-1159853 B1    6/2012
KR    10-1278257 B1    6/2013
(Continued)

OTHER PUBLICATIONS

Jaehoon Lim, et al., "Influence of Shell Thickness on the Performance of Light-Emitting Devices Based on CdSe/$Zn_{1-x}Cd_xS$ Core/Shell Heterostructured Quantum Dots," Advanced Materials, 2014, pp. 8034-8040, vol. 26, WILEY-VCH Verlag GmbH & Co. KGaA, Weinheim.

*Primary Examiner* — Samuel A Gebremariam
(74) *Attorney, Agent, or Firm* — Lewis Roca Rothgerber Christie LLP

(57) ABSTRACT

A quantum dot includes a core and a plurality of shell layers surrounding the core. The core has a band gap less than that of the outermost shell layer, and the outermost shell layer has a band gap less than that of a second shell layer. Thus, a light emitting device including the quantum dot according to an embodiment may have an improved lifespan of the device and excellent luminous efficiency characteristics.

21 Claims, 6 Drawing Sheets

(51) Int. Cl.
  *C09K 11/08* (2006.01)
  *B82Y 40/00* (2011.01)
  *B82Y 20/00* (2011.01)

(56) References Cited

U.S. PATENT DOCUMENTS

| | | |
|---|---|---|
| 9,637,682 B2 | 5/2017 | Jun et al. |
| 10,174,243 B2 | 1/2019 | Greytak et al. |
| 10,221,356 B2 | 3/2019 | Ghosh et al. |
| 2010/0108984 A1* | 5/2010 | Cho .................... C09K 11/565 |
| | | 257/13 |
| 2018/0033856 A1* | 2/2018 | Kwon .................... C09K 11/70 |

FOREIGN PATENT DOCUMENTS

| | | |
|---|---|---|
| KR | 10-1468985 B1 | 12/2014 |
| KR | 10-2018-0027629 A | 3/2018 |
| KR | 10-1941299 B1 | 1/2019 |

\* cited by examiner

QUANTUM DOT AND LIGHTING EMITTING DEVICE COMPRISING THE SAME

CROSS-REFERENCE TO RELATED APPLICATION

This application claims priority to and the benefit of Korean Patent Application No. 10-2020-0017912, filed on Feb. 13, 2020, the entire content of which is hereby incorporated by reference.

BACKGROUND

1. Field

The present disclosure herein relates to a quantum dot and a light emitting device including the same.

2. Description of Related Art

Various display devices utilized in multimedia devices such as televisions, mobile phones, table computers, navigation devices, and/or game consoles are being developed. In such a display device, a so-called self-luminous display element, which realizes display by emitting light from a light emitting material containing an organic compound, may be utilized.

In addition, to improve the color reproducibility of the display device, development of the light emitting device utilizing quantum dots as the light emitting material is in progress, and it is desired to improve lifespan and luminous efficiency of the light emitting device utilizing the quantum dots.

SUMMARY

An aspect according to embodiments of the present disclosure is directed toward a quantum dot including a core and a plurality of shell layers to facilitate injection of charges.

An aspect according to embodiments of the present disclosure is also directed toward a light emitting device to improve lifespan and luminous efficiency of the light emitting device.

According to an embodiment of the present disclosure, a quantum dot includes a core and N shell layers configured to sequentially surround the core, wherein band gaps of the core and the N shell layers satisfy Equation 1 below.

$$BG_0 < BG_N < BG_2 \qquad (1)$$

In Equation 1 above, $BG_0$ is the band gap of the core, $BG_2$ is the band gap of a second shell layer, $BG_N$ is the band gap of an N-th shell layer, and N is an integer of 3 or more.

In an embodiment, the band gap of the N-th shell layer may be less than that of an (N−1)-th shell layer.

In an embodiment, the second shell layer may have a smallest thickness from among thicknesses of the N shell layers.

In an embodiment, the first shell layer may include at least one of ZnSe, ZnS, ZnTe, GaP, GaSe, InSe, InS, AlP, AlSe, AlS, or GaN.

In an embodiment, the first shell layer and the third shell layer may include the same material.

In an embodiment, the core may include at least one of InP, ZnP, GaP, ZnSe, ZnTe, or AlP.

In an embodiment of the present disclosure, a quantum dot includes: a core; a first shell layer configured to surround the core; a second shell layer configured to surround the first shell layer; and a third shell layer configured to surround the second shell layer, wherein the second shell layer has a band gap greater than that of each of the first shell layer and the third shell layer, and the second shell layer has a thickness less than that of each of the first shell layer and the third shell layer.

In an embodiment, the second shell layer may be about 0.3 nm to about 2 nm in thickness.

In an embodiment, the first shell layer may include at least one of ZnSe, ZnS, ZnTe, GaP, GaSe, InSe, InS, AlP, AlSe, AlS, or GaN.

In an embodiment, the first shell layer and the third shell layer may include the same material.

In an embodiment, the core may include at least one of InP, ZnP, GaP, ZnSe, ZnTe, or AlP.

In an embodiment, the quantum dot may further include a plurality of shell layers configured to surround the third shell layer, wherein each of the plurality of shell layers may have a band gap less than that of the third shell layer.

In an embodiment of the present disclosure, a light emitting device includes: a first electrode and a second electrode facing each other; and a light emitting layer between the first electrode and the second electrode and including a plurality of quantum dots, wherein the plurality of quantum dots includes a first quantum dot and a second quantum dot, each of which includes: a core; a first shell layer configured to surround the core; a second shell layer configured to surround the first shell layer; and a third shell layer configured to surround the second shell layer, wherein a distance between the core of the first quantum dot and the core of the second quantum dot ranges from about 5 nm to about 15 nm.

In an embodiment, each of the first shell layer and the third shell layer may have a thickness greater than that of the second shell layer.

In an embodiment, the first shell layer may include at least one of ZnSe, ZnS, ZnTe, GaP, GaSe, InSe, InS, AlP, AlSe, AlS, or GaN.

In an embodiment, each of the first shell layer and the third shell layer may include ZnSe.

In an embodiment, the core may include at least one of InP, ZnP, GaP, ZnSe, ZnTe, or AlP.

In an embodiment, the quantum dot may further include a plurality of shell layers configured to surround the third shell layer, wherein each of the plurality of shell layers may have a band gap less than that of the third shell layer.

In an embodiment, the light emitting device may further include an electron transport region and a hole transport region that are between the first electrode and the second electrode, wherein at least one, of (i) an electron in the electron transport region or (ii) a hole in the hole transport region, may move to the third shell layer. For example, the electron transport region may be to transport the electrode to the third shell layer and/or the hole transport region may be to transport the hole to the third shell layer.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
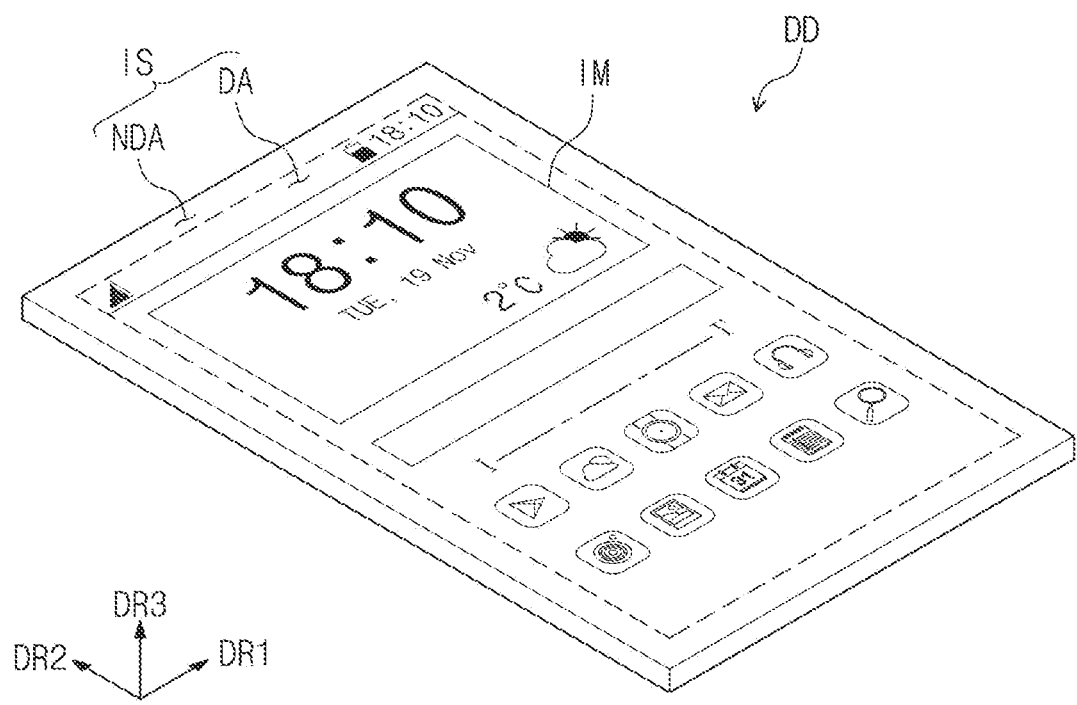
FIG. 1 is a perspective view of a display device according to an embodiment.

As the present disclosure may have diverse modified embodiments, specific embodiments are illustrated in the drawings and are described in the detailed description of the present disclosure. However, this does not limit the present disclosure within specific embodiments and it should be understood that the present disclosure covers all the modifications, equivalents, and replacements within the idea and technical scope of the present disclosure.

In this specification, it will also be understood that when one component (or region, layer, portion) is referred to as being "on", "connected to", or "coupled to" another component, it can be directly disposed/connected/coupled on/to the other component, or an intervening third component may also be present.

In this specification, the term "directly disposed" may refer to that there is no additional layer, film, area, plate, and/or the like between a portion of the layer, the film, the area, the plate, and/or the like and the other portion. For example, "directly disposed" may refer to (one component) being disposed (on another component) without utilizing an additional member such as an adhesion member between two layers or two members.

Like reference numerals refer to like elements throughout. Also, in the figures, the thickness, ratio, and/or dimensions of components may be exaggerated for clarity of illustration.

The term "and/or" includes any and all combinations of one or more of the associated listed items.

It will be understood that although the terms such as "first" and/or "second" are used herein to describe various elements, these elements should not be limited by these terms. The terms are only used to distinguish one component from other components. For example, an element referred to as a first element in an embodiment can be referred to as a second element in another embodiment without departing from the scope of the appended claims. The terms of a singular form may include plural forms unless referred to the contrary.

Also, terms such as "under", "below", "above', "upper", and/or the like are used for explaining relation association of components illustrated in the drawings. The terms may be a relative concept and described based on directions expressed in the drawings. In this specification, the term "disposed on" may refer to a case in which it is disposed on a lower portion as well as an upper portion of any one member.

Unless otherwise defined, all terms (including technical and scientific terms) used herein have the same meaning as commonly understood by a person of ordinary skill in the art to which this invention belongs. Also, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "include" and/or "comprise" when used in this specification, specify the presence of stated features, integers, steps, operations, elements, and/or components, but do not preclude the presence or addition of one or more other features, integers, steps, operations, elements, components, and/or groups thereof.

Hereinafter, a quantum dot according to an embodiment of the present disclosure and a light emitting device including the same will be described with reference to the drawings.

Figure 2:
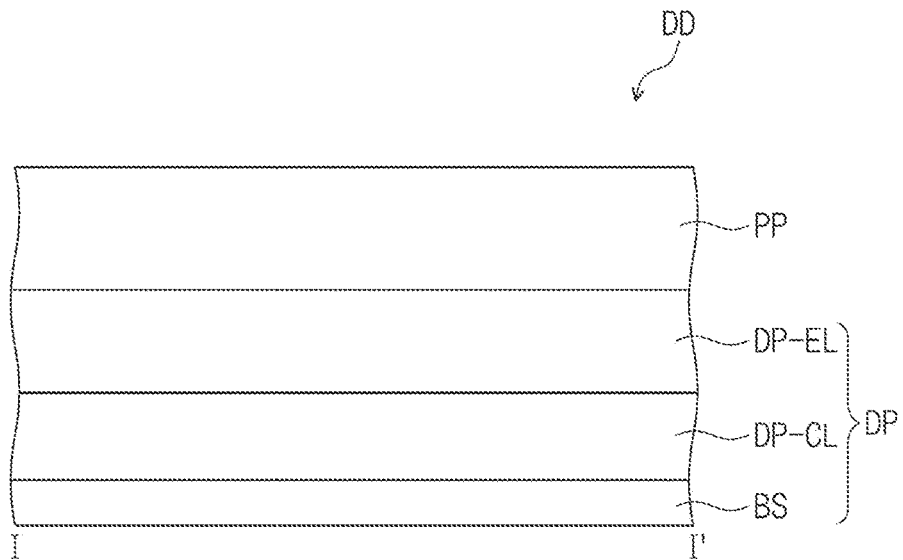
FIG. 2 is a cross-sectional view illustrating a portion cutting along the line I-I' of FIG. 1.
Figure 3:
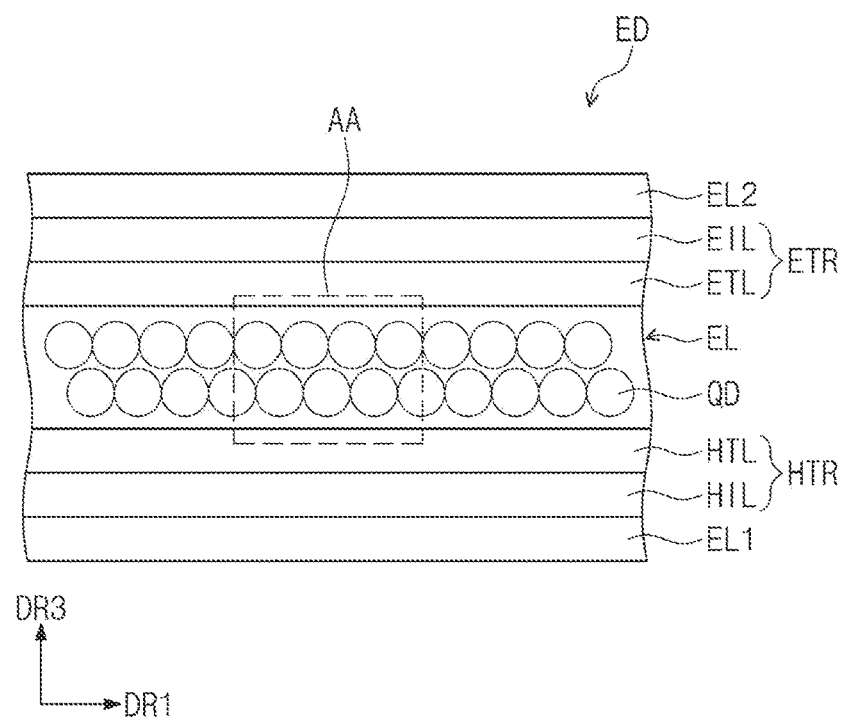
FIG. 3 is a cross-sectional view of a light emitting device according to an embodiment.
Figure 4:
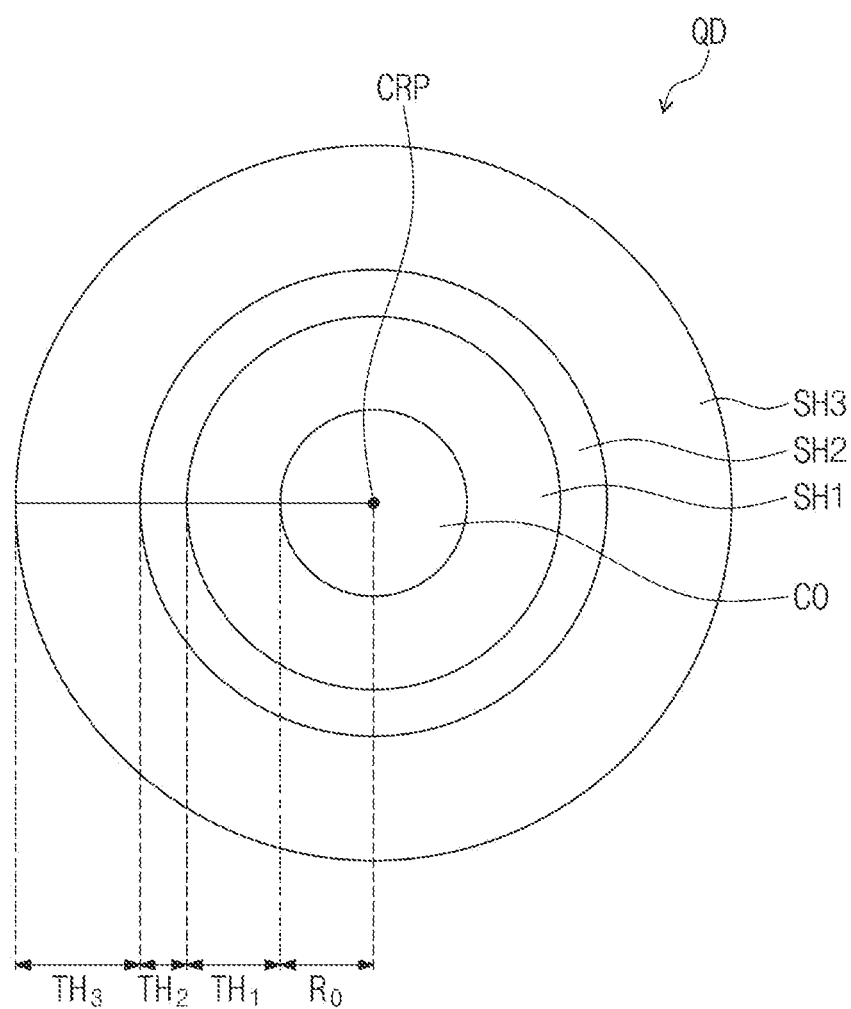
FIG. 4 is a cross-sectional view of a quantum dot according to an embodiment.

FIG. 1 is a perspective view of a display device DD according to an embodiment. FIG. 2 is a cross-sectional view illustrating a portion cutting along the line I-I' of FIG. 1 in the display device DD according to an embodiment. FIG. 3 is a cross-sectional view of a light emitting device ED according to an embodiment. FIG. 4 is a cross-sectional view of a quantum dot QD according to an embodiment.

In FIG. 1, a portable electronic device is illustrated as the display device DD. However, the display device DD may be applied to larger electronic devices such as a television, a monitor, and/or an external billboard as well as smaller and/or medium sized electronic devices such as a personal computer, a personal computer, a notebook computer, a personal digital terminal, a car navigation unit, a game console, a smart phone, a tablet, and/or a camera. Also, the above-described devices are described merely as an embodiment, and thus, the display device DD may be adopted for other suitable electronic devices without departing from the spirit and scope of the present disclosure.

Referring to FIG. 1, the display device DD may display an image IM through a display surface IS. The display surface IS includes a display area DA on which the image IM is displayed and a non-display area NDA that is adjacent to the display area DA. The non-display area NDA is an area on which an image is not displayed.

The display area DA may have a rectangular shape. The non-display area NDA may surround the display area DA. However, the embodiment of the present disclosure is not limited thereto. For example, the display area DA and the non-display area NDA may be relatively designed in shape. Also, the non-display area NDA may not exist on the entire surface of the display device DD. That is, the non-display area NDA may be around or only surround a portion of the display area DA on the surface of the display device DD.

The display device DD according to an embodiment may include a display panel DP and a light control layer PP disposed on the display panel DP. The display panel DP may include a display device layer DP-EL. The display device layer DP-EL includes a light emitting device ED.

The display device DD may include a plurality of light emitting devices ED. The light control layer PP may be disposed on the display panel DP to control reflection of external light by the display panel DP. The light control layer PP may include, for example, a polarizing layer and/or a color filter layer.

In the display device DD according to an embodiment, the display panel DP may be an emissive display panel. For example, the display panel DP may be a quantum dot light emitting display panel including a quantum dot light emitting device. However, the embodiment of the present disclosure is not limited thereto.

The display panel DP includes a base substrate BS, a circuit layer DP-CL disposed on the base substrate BS, and a display device layer DP-EL disposed on the circuit layer DP-CL.

The base substrate BS may be a member that provides a base surface on which the display device layer DP-EL is disposed. The base substrate BS may be a glass substrate, a metal substrate, and/or a plastic substrate. However, the embodiment of the present disclosure is not limited thereto. For example, the base substrate BS may be an inorganic layer, an organic layer, or a composite layer. The base substrate BS may be a flexible substrate that is capable of being easily bent or folded.

In an embodiment, the circuit layer DP-CL may be disposed on the base substrate BS, and the circuit layer DP-CL may include a plurality of transistors. In an embodiment, the transistors may each include a control electrode, an input electrode, and an output electrode. For example, the circuit layer DP-CL may include a switching transistor and a driving transistor for driving the light emitting device ED of the display device layer DP-EL.

FIG. 3 is a view illustrating the light emitting device ED according to an embodiment. Referring to FIG. 3, the light emitting device ED according to an embodiment may include a first electrode EL1, a second electrode EL2 facing the first electrode EL1, and a plurality of functional layers disposed between the first electrode EL1 and the second electrode EL2 and including an emission layer EL.

The plurality of functional layers include a hole transport region HTR disposed between the first electrode EL1 and the emission layer EL and an electron transport region ETR disposed between the emission layer EL and the second electrode EL2. In an embodiment, a capping layer may be further disposed on the second electrode EL2.

Each of the hole transport region HTR and the electron transport region ETR may include at least one sub-functional layer. For example, the hole transport region HTR may include at least one of a hole injection layer HIL or a hole transport layer HTL as the sub-functional layer, and the electron transport region ETR may include at least one of an electron injection layer EIL or an electron transport layer ETL as the sub-function layer.

The hole transport region HTR may be provided as one (e.g., a single) functional layer. For example, the hole transport region HTR may include only the hole injection layer HIL or the hole transport layer HTL. Also, the electron transport region ETR may be provided as one (e.g., a single) functional layer. For example, the electron transport region ETR may include only the electron injection layer EIL or the electron transport layer ETL. However, the embodiment of the present disclosure is not limited thereto. For example, in an embodiment, the hole transport region HTR may further include an electron blocking layer as the sub-functional layer, and the electron transport region ETR may further include a hole blocking layer as the sub-functional layer.

In the light emitting device ED according to an embodiment, the first electrode EL1 has conductivity (e.g., is a conductor). The first electrode EL1 may be made of a metal alloy or a conductive compound. The first electrode EU may be an anode. The first electrode EL1 may be the pixel electrode.

In the light emitting device ED according to an embodiment, the first electrode EL1 may be a reflective electrode. However, the embodiment of the present disclosure is not limited thereto. For example, the first electrode EL1 may be a transmissive electrode or a transflective electrode. When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. Alternatively, the first electrode EL1 may have a multi-layered structure including a reflective layer or a transflective layer and a transparent conductive layer made of indium tin oxide (ITO), indium zinc oxide (IZO), zinc oxide (ZnO), and/or indium tin oxide (ITZO). For example, the first electrode EU may be a multilayered metal layer, for example, have a structure in which metal layers of ITO/Ag/ITO are laminated.

The hole transport region HTR is provided on the first electrode EL1. The hole transport region HTR may include the hole injection layer HIL and the hole transport layer HTL. In an embodiment, the hole transport region HTR may further include at least one of a hole buffer layer or an electron blocking layer in addition to the hole injection layer HIL and the hole transport layer HTL. The hole buffer layer may increase emission efficiency by compensating for a resonance distance according to a wavelength of light emitted from the emission layer EL. As a material contained in the hole buffer layer, any material suitable for the hole transport region HTR may be utilized. The electron blocking layer is a layer that prevents or substantially prevents electrons from being injected from the electron transport region ETR to the hole transport region HTR.

The hole transport region HTR may have a single layer made of a single material, a single layer made of materials different from each other, or a multi-layered structure including a plurality of layers made of materials different from each other. For example, the hole transport region HTR may have a single layer structure made of a plurality of materials different from each other or may have a multi-layered structure of a hole injection layer (HIL)/hole transport layer (HTL), a hole injection layer (HIL)/hole transport layer (HTL)/hole buffer layer, a hole injection layer (HIL)/hole buffer layer, a hole transport layer (HTL)/hole buffer layer, a hole buffer layer/hole transport layer (HTL), a hole injection layer (HIL)/hole transport layer (HTL)/electron blocking layer, or a hole buffer layer/hole injection layer (HIL)/hole transport layer (HTL), but the embodiment is not limited thereto.

The hole transport region HTR may be formed by utilizing various suitable methods such as a vacuum deposition method, a spin coating method, a casting method, a Langmuir-Blodgett (LB) method, an inject printing method, a laser printing method, and/or a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), and polyaniline/poly(4-styrenesulfonate) (PANI/PSS), N,N'-di(naphthalene-1-yl)-N,N'-diphenyl-benzidine (NPB), polyether ketones containing triphenylamine (TPAPEK), 4-Isopropyl-4'-methyldiphenyliodonium Tetrakis(pentafluorophenyl) borate], dipyrazino[2,3-f: 2',3'-h] quinoxaline-2,3,6,7,10,11-hexacarbonitrile (HAT-CN), and/or the like.

The hole transport layer HTL may include, for example, a carbazole-based derivative (such as N-phenylcarbazole and/or polyvinylcarbazole), a fluorene-based derivative, a triphenylamine-based derivative (such as N,N'-bis(3-methylphenyl)-N,N'-diphenyl-[1,1-biphenyl]-4,4'-diamine (TPd) and/or 4,4',4"-tris(N-carbazolyl)triphenylamine (TCTA)), N,N'-di(naphthalene-1-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), and/or the like.

The emission layer EL may be disposed on the hole transport region HTR. In the light emitting device ED according to an embodiment, the emission layer EL may include a plurality of quantum dots QD.

The quantum dot QD may include a core CO and N shell layers surrounding the core CO. According to an embodiment, a band gap $BG_0$ of the core CO and band gaps $BG_2$ of the second shell layer and $BG_N$ of the N-th shell layer may satisfy a relationship of Equation 1 below.

$$BG_0 < BG_N < BG_2 \quad (1)$$

The band gap $BG_0$ of the core CO may be less than a band gap $BG_N$ of the N-th shell layer, and the band gap $BG_N$ of the N-th shell layer may be less than a band gap $BG_2$ of the second shell layer SH2. The second shell layer SH2 may surround a first shell layer SH1, and the first shell layer SH1 may surround the core CO.

Equation 1 and each of the band gaps $BG_0$, $BG_2$, and $BG_N$ will be described in more detail later with reference to FIGS. 6 and 7.

In FIG. 3, although the quantum dots QD, each of which has a circular cross-section, are shown to be disposed adjacent to each other to form two layers, the embodiment of the present disclosure is not limited thereto. For example, the arrangement of the quantum dots QD may vary depending on a thickness of the emission layer EL, a shape of each of the quantum dots QD provided in the emission layer EL, and an average diameter of the quantum dots QD. In an embodiment, the quantum dots QD may be irregularly arranged, unlike that illustrated in FIG. 3. Alternatively, the quantum dots QD may be arranged at regular intervals so that the quantum dots QD are not adjacent to each other.

The emission layer EL may have a thickness of, for example, about 10 nm to about 50 nm. As described above, the emission layer EL may include the quantum dots QD according to an embodiment.

In FIG. 3, the quantum dot QD may be schematically illustrated, and a structure of the quantum dot QD according to an embodiment is illustrated in FIG. 4.

Referring to FIG. 4, the quantum dot QD according to an embodiment may include a core CO, a first shell layer SH1, a second shell layer SH2, and a third shell layer SH3. The first shell layer SH1 may surround the core CO, and the second shell layer SH2 may surround the first shell layer SH1. Also, the third shell layer SH3 may surround the second shell layer SH2. In FIG. 4, the three shell layers are illustrated to surround the core CO, but the embodiment is not limited thereto. For example, the quantum dot QD may include a core and four shell layers surrounding the core. That is, the quantum dot QD may further include a fourth shell layer surrounding the third shell layer SH3. Further, in an embodiment, the quantum dot QD may further include a ligand bound to a surface of the quantum dot.

The core CO of the quantum dot may be selected from Group II-VI compounds, Group compounds, Group III-V compounds, Group IV-VI compounds, Group IV elements, Group IV compounds, and a combination thereof.

The Group II-VI compounds may be selected from binary element compounds selected from the group consisting of CdSe, CdTe, CdS, ZnS, ZnSe, ZnTe, ZnO, HgS, HgSe, HgTe, MgSe, MgS, and a combination thereof; ternary element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group compounds may be selected from ternary compounds selected from the group consisting of $AgInS_2$, $CuInS_2$, $AgGaS_2$, $CuGaS_2$ and mixtures thereof or quaternary compounds such as $AgInGaS_2$ and/or $CuInGaS_2$.

The Group III-V compounds may be selected from binary element compounds selected from the group consisting of GaN, GaP, GaAs, GaSb, AlN, AlP, AlAs, AlSb, InN, InP, InAs, InSb, and a combination thereof; ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof; and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. For example, InZnP and/or the like may be selected as the group III-II-V compounds.

The Group IV-VI compounds may be selected from binary element compounds selected from the group consisting of SnS, SnSe, SnTe, PbS, PbSe, PbTe, and a combination thereof; ternary element compounds selected from the group consisting of SnSeS, SnSeTe, SnSTe, PbSeS, PbSeTe, PbSTe, SnPbS, SnPbSe, SnPbTe, and a combination thereof; and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof.

The first shell layer SH1 according to an embodiment may include at least one of ZnSe, ZnS, ZnTe, GaP, GaSe, InSe, InS, AlP, AlSe, AlS, or GaN. For example, the first shell layer SH1 may include ZnSe. However, the embodiment of the present disclosure is not limited thereto.

The core CO according to an embodiment may include InP. For example, the core CO may include at least one of InP, InZnP, InGaP, or InAlP, the first shell layer SH1 may include at least one of ZnSe or GaP, the second shell layer SH2 may include at least one of ZnS or GaN, and the third shell layer SH3 may include at least one of ZnSe or GaP. Alternatively, the core CO according to an embodiment may include ZnSe. For example, the core CO may include ZnTeSe, each of the first shell layer SH1 and the third shell layer SH3 may include ZnSe, and the second shell layer SH2 may include ZnS. However, this is merely an example, and the embodiment of the present disclosure is not limited thereto.

A material contained in the core CO and materials contained in the shell layers SH1, SH2, and SH3 may be different from each other. The materials of the shell layers SH1, SH2, and SH3 may be the same or different from each other. For example, the material of the first shell layer SH1 and the third shell layer SH3 may be the same.

Referring to FIG. 4, the core CO may include a central portion CRP, and a distance RO from the central portion CRP to the surface of the core CO is illustrated. For example, as illustrated in FIG. 4, when the quantum dot QD has a spherical shape, the distance RO from the center CRP to the surface of the core CO may be a radius of a sphere. However, the embodiment of the present disclosure is not limited thereto.

According to an embodiment, a thickness TH2 of the second shell layer SH2 may be less than a thickness TH1 of the first shell layer SH1 and a thickness TH3 of the third shell layer SH3. The thickness TH2 of the second shell layer SH2 may range from about 0.3 nm to about 2 nm. For example, the thickness TH2 of the second shell layer SH2 may be about 1.5 nm, the thickness TH1 of the first shell layer SH1 and a thickness TH3 of the third shell layer SH3 may be the same as each other, for example, may each be about 4 nm. In an embodiment, the thickness TH2 of the second shell layer SH2 may be about 1.5 nm, the thickness TH1 of the first shell layer SH1 may be about 4 nm, and the thickness TH3 of the third shell layer SH3 may be about 6 nm. However, the embodiment of the present disclosure is not limited thereto.

The first shell layer SH1 existing between the core CO and the second shell layer SH2 may relieve stress caused by a difference in lattice constant between the core CO and the second shell layer SH2. The third shell layer SH3 may increase the size of the quantum dot QD to mitigate a phenomenon in which efficiency of the quantum dot decreases due to energy transfer between the quantum dots QD adjacent to each other. The quantum dot QD according to an embodiment may include a plurality of shell layers to improve lifespan and emission efficiency of the light emitting device.

Figure 5:
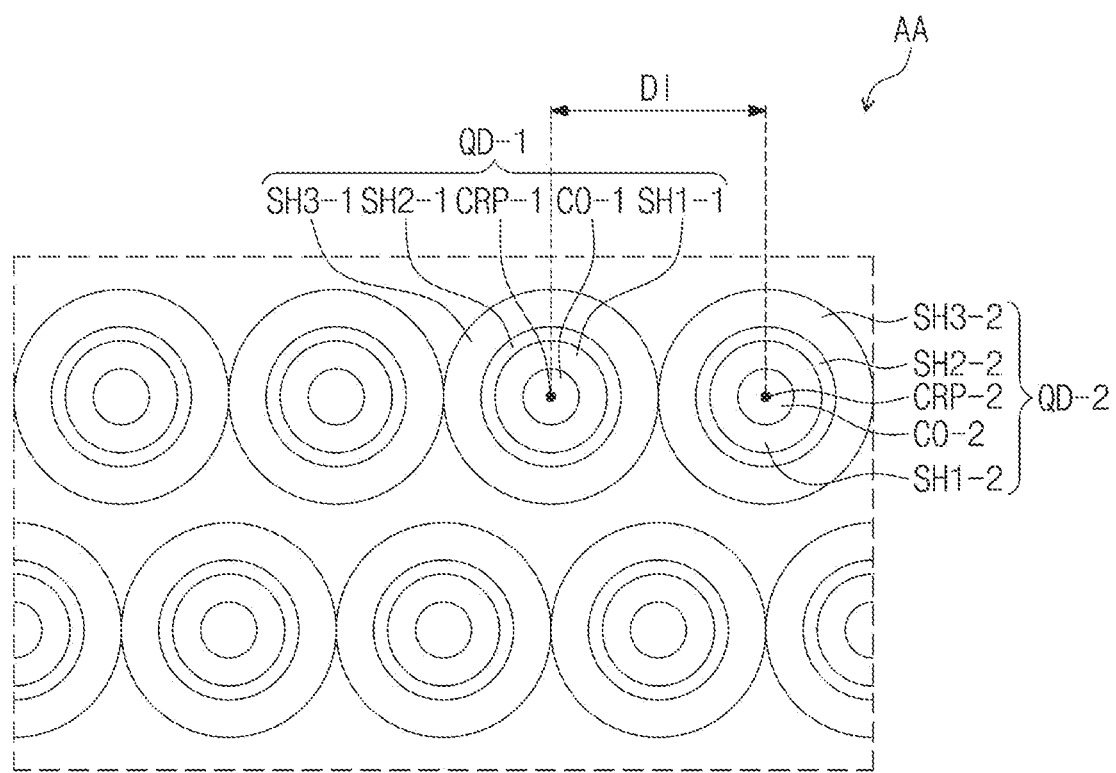
FIG. 5 is a cross-sectional view illustrating a portion corresponding to the area AA of FIG. 3.

FIG. 5 is an enlarged view of a portion corresponding to the area AA of FIG. 3 and illustrates a first quantum dot QD-1 and a second quantum dot QD-2, which are adjacent to each other. As described above, the first quantum dot QD-1 and the second quantum dot QD-2 may include cores CO-1 and CO-2, first shell layers SH1-1 and SH1-2, second shell layers SH2-1 and SH2-2, and third shell layers SH3-1 and SH3-2, respectively. Also, the core CO-1 of the first quantum dot QD-1 may include a first central portion CRP-1, and the core CO-2 of the second quantum dot QD-2 may include a second central portion CRP-2.

A distance DI between the first central portion CRP-1 and the second central portion CRP-2 may range from about 5 nm or about 15 nm. That is, a minimum distance DI from the first central portion CRP-1 to the second central portion CRP-2 may be about 5 nm.

The distance DI between the first central portion CRP-1 and the second central portion CRP-2 may vary depending on the thickness of each of the shell layers SH1, SH2, and SH3 surrounding the core CO. Although three shell layers are illustrated in FIGS. 4 and 5, the distance DI between the first central portion CRP-1 and the second central portion CRP-2 may increase when a plurality of shell layers are further provided.

Figure 6:
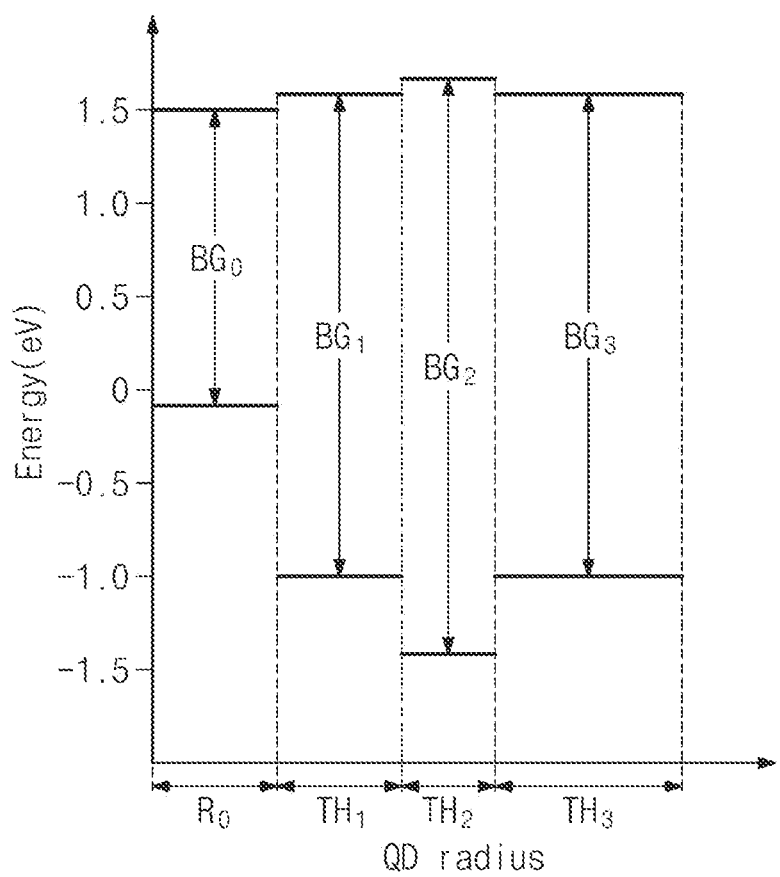
FIG. 6 is a schematic graph illustrating an energy level of the quantum dot according to an embodiment.
Figure 7:
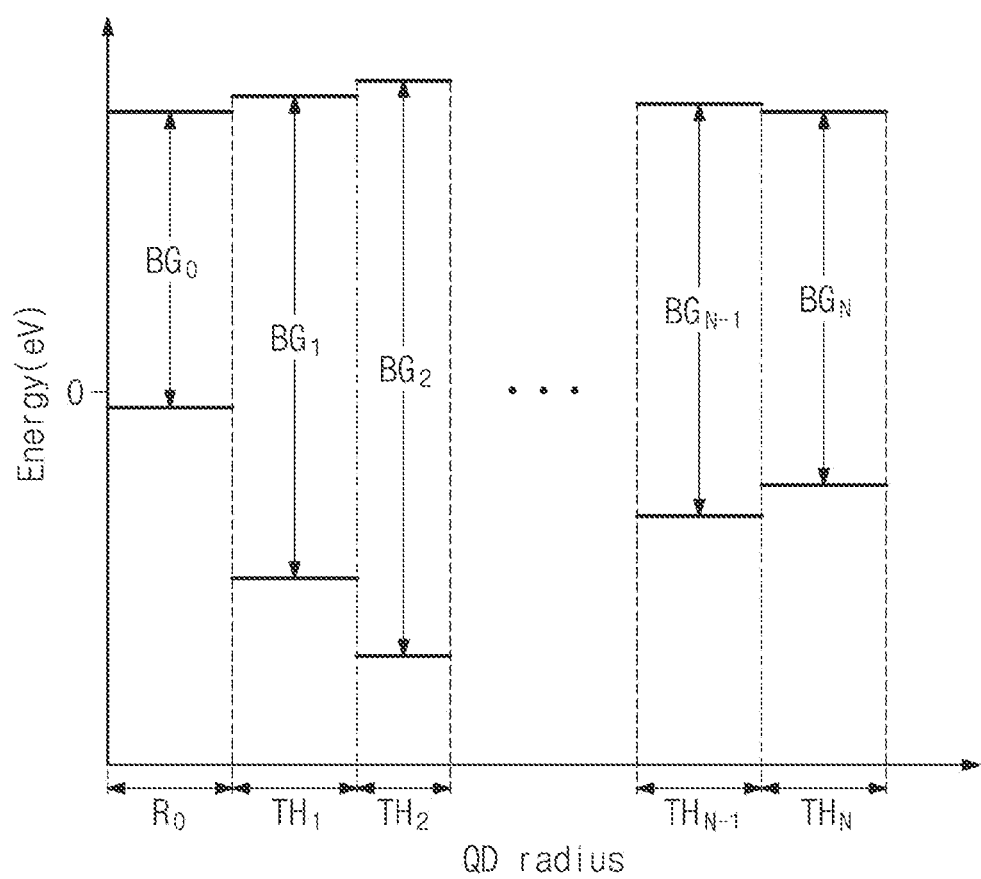
FIG. 7 is a schematic graph illustrating an energy level of the quantum dot according to an embodiment.

FIGS. 6 and 7 are each schematic graphs illustrating an energy level of the quantum dot QD according to an embodiment. In more detail, FIG. 6 illustrates an energy level of the core CO and energy levels of the shell layers SH1, SH2, and SH3 according to a radius of the quantum dot QD, and FIG. 7 illustrates an energy level of the core CO and energy levels of the shell layers SH1, SH2 . . . SHN according to a radius of the quantum dot QD. That is, the energy level according to the distance from the central portion CRP of the quantum dot QD is illustrated, for example, band gaps $BG_0$, $BG_1$, $BG_2$, $BG_3$, $BG_{N-1}$, and $BG_N$ are illustrated.

Each of the band gaps $BG_0$, $BG_1$, $BG_2$, $BG_3$, $BG_{N-1}$, and $BG_N$ represents a difference between an energy level of a conduction band and an energy level of a valence band. FIG. 6 illustrates the band gap $BG_0$ of the core CO, the band gap $BG_1$ of the first shell layer SH1, the band gap $BG_2$ of the second shell layer SH2, and the band gap BG3 of the third shell layer SH3. FIG. 7 illustrates the band gap $BG_0$ of the core CO, the band gap $BG_1$ of the first shell layer SH1, the band gap $BG_2$ of the second shell layer SH2, the band gap $BG_{N-1}$ of the (N−1)-th shell layer $BG_{N-1}$, and the band gap $BG_N$ of the N-th shell layer. This is merely an example. For example, energy level values illustrated in FIG. 7 may vary depending on the materials contained in the core CO and the shell layers SH1, SH2, and SH3, but the same tendency may be applied. Each of the (N−1)-th shell layer and the N-th shell layer may have a set or predetermined thickness ($TH_{N-1}$, $TH_N$).

Referring to FIG. 6, the band gap $BG_0$ of the core CO may be less than each of the band gap $BG_1$ of the first shell layer SH1, the band gap $BG_2$ of the second shell layer SH2, and the band gap $BG_3$ of the third shell layer SH3. That is, from among the band gaps $BG_0$, $BG_1$, $BG_2$, and $BG_3$ of the core CO and the shell layers SH1, SH2, and SH3, the band gap $BG_0$ of the core CO may represent the smallest value. The band gap $BG_2$ of the second shell layer SH2 may be greater than each of the band gap $BG_0$ of the core CO and the band gap $BG_3$ of the third shell layer SH3.

Also, the quantum dot QD including the core CO and the N shell layers surrounding the core CO according to an embodiment may satisfy the relationship of Equation 1 described above.

$$BG_0 < BG_N < BG_2 \qquad (1)$$

The band gap $BG_0$ of the core CO may be less than a band gap $BG_N$ of an N-th shell layer, and the band gap $BG_N$ of the N-th shell layer may be less than a band gap $BG_2$ of a second shell layer SH2. Also, the band gap $BG_N$ of the N-th shell layer may be less than the band gap $BG_{N-1}$ of the (N−1)-th shell layer.

In the case of including the plurality of shell layers, each of the band gaps of the plurality of shell layers may be less than the band gaps $BG_2$ of the second shell layer SH2, and each of the band gaps of the plurality of shell layers may be less than the band gap of the previous shell layer. Each of the band gaps of the plurality of shell layers may be greater than the band gap $BG_0$ of the core CO. For example, in the case of the quantum dot when N is 5, a fourth shell layer surrounding the third shell layer and a fifth shell layer surrounding the fourth shell layer may be provided. The band gap of the fourth shell layer may be less than that of the third shell layer, and the band gap of the fifth shell layer may be less than the band gap of the fourth shell layer. The case in which N is 5 has been described as an example, but the embodiment is not limited thereto. Here, N is an integer greater than or equal to 3. The quantum dot according to an embodiment may include a plurality of shell layers, and the core and the plurality of shell layers may satisfy the relationship of Equation 1.

According to an embodiment, at least one of a hole in the hole transport region HTR or an electron in the electron transport region ETR to be described later may move to the third shell layer SH3. That is, a hole in the hole transport region HTR and/or an electron in the electron transport region ETR to be described later may move to the third shell layer SH3. In another embodiment, at least one of the hole in the hole transport region HTR or the electron in the electron transport region ETR to be described later may move to the N-th shell layer. That is, at least one of the hole in the hole transport region HTR or the electron in the electron transport region ETR to be described later may move to the shell layer having the smallest band gap. For example, in the case of the quantum dot including five shell layers, at least one of the hole in the hole transport region HTR or the electron in the electron transport region ETR to be described later may move to the fifth shell layer.

The quantum dots QD may control a color of light emitted according to a particle size thereof, and thus, the quantum dots QD may have various suitable emission colors such as blue, red, and/or green colors. As the particle size of the quantum dot QD decreases, light having a short wavelength region may be emitted. For example, a particle size of the quantum dot emitting the green light from among the quantum dots QD having the same core CO may be less (e.g., smaller) than that of the quantum dot emitting the red light. Also, the particle size of the quantum dot emitting the blue light from among the quantum dots QD having the same core CO may be less (e.g., smaller) than that of the quantum dot emitting the green light. However, the embodiment is not limited thereto. For example, the particle size may be adjusted according to the material for forming the shell layers SH1, SH2, and SH3 and the thickness of each of the shell layers SH1, SH2, and SH3 even in the quantum dots QD having the same core CO.

When the quantum dots QD have various suitable emission colors such as the blue, red, and/or green colors, the quantum dots QD having different emission colors may have different core materials.

In the light emitting device ED according to an embodiment, the emission layer EL may include a host and a dopant. In an embodiment, the emission layer EL may include the quantum dots QD as a dopant material. Also, in an embodiment, the emission layer EL may further include a host material.

In the light emitting device ED according to an embodiment, the emission layer EL may emit fluorescence. For example, the quantum dots QD may be utilized as a fluorescent dopant material.

The emission layer EL may be formed by utilizing various suitable methods such as a vacuum deposition method, a spin coating method, a casting method, a Langmuir-Blodgett (LB) method, an inject printing method, a laser printing method, and/or a laser induced thermal imaging (LITI) method.

In the light emitting device ED according to an embodiment, the electron transport region ETR is provided on the emission layer EL. The electron transport region ETR may include at least one of the electron blocking layer, the electron transport layer ETL, or the electron injection layer EIL, but the present disclosure is not limited thereto.

The electron transport region ETR may have a single layer made of a single material, a single layer made of materials different from each other, or a multi-layered structure including a plurality of layers made of materials different from each other.

For example, the electron transport region ETR may have a single layer structure of the electron injection layer EIL or the electron transport layer ETL, or a single layer structure made of an electron injection material or an electron transport material. Also, the electron transport region ETR may have a single layer structure made of a plurality of materials different from each other or a multi-layered structure of the electron transport layer ETL/the electron injection layer EIL or the electron blocking layer/the electron transport layer ETL/the electron injection layer EIL, which are sequentially laminated from the emission layer EL, but the present disclosure is not limited thereto. The electron transport region ETR may have a thickness of, for example, about 200 Å to about 1500 Å.

The electron transport region ETR may be formed by utilizing various suitable methods such as a vacuum deposition method, a spin coating method, a casting method, a Langmuir-Blodgett (LB) method, an inject printing method, a laser printing method, and/or a laser induced thermal imaging (LITI) method.

When the electron transport region ETR includes the electron transport layer ETL, the electron transport region ETR may include an anthracene-based compound. However, the embodiment of the present disclosure is not limited thereto. For example, the electron transport region ETR (e.g., the electron transport layer ETL) may include tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-yl)phenyl)-9,10-dinaphthylanthracene, 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato) aluminum (BAlq), berylliumbis(benzoquinolin-10-olate (Bebq2), 9,10-di(naphthalene-2-yl)anthracene (ADN), and/or a mixture thereof. Each of the electron transport layers ETL (e.g., the electron transport layer ETL) may have a thickness of about 100 Å to about 1,000 Å, for example, about 150 Å to about 500 Å. When each of the electron transport layers ETL has a thickness within the above-described ranges, satisfactory electron injection characteristics may be achieved without substantially increasing in driving voltage.

When the electron transport region ETR includes the electron injection layer EIL, the electron transport region ETR (e.g., the electron injection layer EIL) may include metal halide, a lanthanum group metal, or a co-deposited material of the metal halide and the lanthanum group metal. The metal halide may be an alkali metal halide. For example, the electron transport region ETR may include LiF, lithium quinolate (Liq), $Li_2O$, BaO, NaCl, CsF, Yb, RbCl, RbI, KI, and/or KI:Yb, but the embodiment is limited thereto. The electron injection layer EIL may be made of a mixture of the electron transport material and a material containing a non-conductive organo metal salt. For example, the organo metal salt may include metal acetate, metal benzoate, metal acetoacetate, metal acetylacetonate, and/or metal stearate. Each of the electron injection layers EIL (e.g., the electron injection layer EIL) may have a thickness of about 1 Å to about 100 Å, for example, about 3 Å to about 90 Å. When each of the electron injection layers EIL has a thickness within the above-described ranges, satisfactory electron injection characteristics may be achieved without substantially increasing in driving voltage.

As described above, the electron transport region ETR may include a hole blocking layer. For example, the hole blocking layer may include at least one of 2,9-dimethyl-4,7-diphenyl-1,10-phenanthroline (BCP), or 4,7-diphenyl-1,10-phenanthroline (Bphen), but the present disclosure is not limited thereto.

The second electrode EL2 may be disposed on the electron transport region ETR. The second electrode EL2 may be a common electrode and/or negative electrode. The second electrode EL2 may be a transmissive electrode, a transflective electrode, or a reflective electrode. When the second electrode EL2 is the transmissive electrode, the second electrode EL2 may be made of metal oxide, for example, indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In an embodiment, the first electrode EL1 may have a structure of a plurality of layers including a reflective layer or transflective layer and a transparent conductive layer made of indium tin oxide (ITO), indium zinc oxide (IZO), zinc oxide (ZnO), and/or indium tin zinc oxide (ITZO).

In an embodiment, the second electrode EL2 may be connected to an auxiliary electrode. When the second electrode EL2 is connected to the auxiliary electrode, the second electrode EL2 may be reduced in resistance.

Hereinafter, the quantum dot according to an embodiment of the present disclosure and the light emitting device including the same will be described in more detail. The following embodiment is merely examples to aid understanding of the present disclosure, and the scope of the inventive disclosure is not limited thereto.

The quantum dots according to an embodiment of the present disclosure may be synthesized, for example, as follows. However, the method of synthesizing the quantum dots according to an embodiment of the present disclosure is not limited thereto.

1. InP Core Synthesis

About 4 mmol of indium acetate and about 12 mmol of palmitic acid were injected together with about 100 mL of octadecene into a 3-neck flask having a capacity (e.g., volume) of about 250 mL. The resultant mixture was stirred utilizing a magnetic stirring bar under a vacuum atmosphere and heated to about 120° C. for about 1 hour and then changed into an argon atmosphere to prepare an $In(PA)_3$ solution. After raising the temperature of the $In(PA)_3$ solution to about 280° C. and maintaining the temperature for about 1 hour, about 10 mL of 0.2 M tris(trimethylsilyl)phospine/trioctylphosphine was rapidly injected utilizing a syringe to grow crystals for about 30 minutes at about 260° C. Thereafter, about 52 mL of a 0.2 M $In(PA)_3$ solution and about 26 mL of a 0.2 M tris(trimethylsilyl)phospine/trioctylphosphine were injected for about 35 minutes at a rate of about 1.5 ml/min and about 0.75 ml/min, respectively. After a stabilization time of about 10 minutes, the temperature of the reactor was cooled to room temperature by removing a heat source to synthesize the InP core.

The synthesized InP core underwent a purification process. After mixing about 40 mL of acetone and about 10 mL of ethanol per about 10 mL of the InP core solution, centrifugation at a speed of about 9,000 rpm was performed to remove a supernatant liquid and disperse a precipitate into toluene. It was confirmed that an optical density of about 10 μl of the InP core dispersed in about 990 μl of toluene was about 0.26 based on a first exciton peak (exciton peak position).

2. InP Core Surface Treatment 1.6 mmol zinc acetate, 3.2 mmol oleic acid, and 80 mL trioctylamine were mixed in a 3-neck flask having a capacity of 250 mL and then mixed utilizing a magnetic stirring bar at a temperature of about 120° C. for about 1 hour under a vacuum atmosphere. After changed into an argon atmosphere, the temperature was maintained at about 280° C. for about 1 hour and then lowered to about 180° C., and a 12 mL InP core solution dispersed in toluene was rapidly injected utilizing a syringe. After about 5 minutes, a 0.2 mL HF solution (10 wt % in acetone) was injected and maintained for about 10 minutes to prepare a surface-treated InP core solution.

3-1. Synthesis of Quantum Dot Including InP, ZnS, and ZnSe According to Comparative Example 1

The reactor temperature of the surface-treated InP core solution was raised to about 320° C. After about 11.2 mmol of 0.4 M $Zn(OA)_2$ was injected and about 1.2 mmol of S/trioctylphosphine (e.g., trioctylphosphine sulfide) was injected, a first shell layer containing ZnS was grown for about 1 hour. Thereafter, about 6.0 mmol of Se/trioctylphosphine (e.g., trioctylphosphine selenide) was injected, and a second shell layer containing ZnSe was grown for about 1 hour.

3-2. Synthesis of Quantum Dot Including InP, ZnS, and ZnSe According to Comparative Example 2

The reactor temperature of the surface-treated InP core solution was raised to about 320° C. After about 22 mmol of 0.4 M $Zn(OA)_2$ was injected and about 1.2 mmol of S/trioctylphosphine (e.g., trioctylphosphine sulfide) was injected, a first shell layer containing ZnS was grown for about 1 hour. Thereafter, about 20 mmol of Se/trioctylphosphine (e.g., trioctylphosphine selenide) was injected, and a second shell layer containing ZnSe was grown for about 1 hour.

3-3. Synthesis of Quantum Dot Including InP, ZnSe, ZnS, and ZnSe According to Embodiment 1

The reactor temperature of the surface-treated InP core solution was raised to about 320° C. After about 15 mmol of 0.4 M $Zn(OA)_2$ was injected, about 4.0 mmol of Se/trioctylphosphine (e.g., trioctylphosphine selenide) was injected, and a first shell layer containing ZnSe was grown for about 1 hour. Thereafter, about 3.0 mmol of S/trioctylphosphine (e.g., trioctylphosphine sulfide) was injected, and a second shell layer containing ZnS was grown for about 1 hour. Thereafter, about 6.0 mmol of Se/trioctylphosphine (e.g., trioctylphosphine selenide) was injected, and a third shell layer containing ZnSe was grown for about 1 hour.

3-4. Synthesis of Quantum Dot Including InP, ZnSe, ZnS, and ZnSe According to Embodiment 2

The reactor temperature of the surface-treated InP core solution is raised to about 320° C. After about 25 mmol of 0.4 M $Zn(OA)_2$ was injected, about 4.0 mmol of Se/trioctylphosphine (e.g., trioctylphosphine selenide) was injected, and a first shell layer containing ZnSe was grown for about 1 hour. Thereafter, about 3.0 mmol of S/trioctylphosphine (e.g., trioctylphosphine sulfide) was injected, and then a second shell layer containing ZnS was grown for about 1 hour. Thereafter, about 15.2 mmol of Se/trioctylphosphine (e.g., trioctylphosphine selenide) was injected, and then a third shell layer containing ZnSe was grown for about 1 hour.

4. Purification of Quantum Dot

About 2 5 mL of octane, about 25 mL of acetone, and about 10 mL of ethanol were mixed in about 10 mL of each of the solutions according to Comparative Example 1, Comparative Example 2, Embodiments 1, and Embodiment 2, respectively. Then, each of the mixtures was centrifuged for about 10 minutes at a speed of about 10,000 rpm. After removing the supernatant solution and dispersing the precipitate in octane, about 40 mL of acetone was added per about 10 mL of each of the solutions according to Comparative Examples and Embodiments. Then, the mixture was repeatedly centrifuged three times for about 10 minutes at a speed of about 10,000 rpm. Thereafter, each of the solutions was dispersed in octane at a concentration of about 10 mg/mL to purify the quantum dot solution.

5. Preparation of EL-QD Device

An ITO (120 nm) substrate patterned on glass was cleaned utilizing a UV-ozone cleaner for about 10 minutes and then heated at about 250° C. for about 10 minutes. After applying a PEDOT:PSS aqueous solution on the ITO substrate cooled to room temperature at about 3,000 rpm (ramp up time of about 3 sec, coating time of about 30 sec) through a spin coating process, the resultant material was baked on a hotplate at about 150° C. for about 10 minutes so as to be formed to a thickness of about 50 nm. Thereafter, the TFB solution dispersed in chlorobenzene was coated at a speed of about 3,000 rpm (ramp up time of about 3 sec, coating time of about 30 sec) and then baked at about 150° C. for 10 minutes on the hotplate so as to be formed to a thickness of about 30 nm. The quantum dots having a concentration of about 10 mg/mL were coated at about 3,000 rpm (ramp up time of about 3 sec, coating time of about 30 sec) and then baked at about 100° C. for about 10 minutes on the hotplate so as to be formed to a thickness of about 20 nm. Thereafter, a 5 nm-sized ZnMgO ethanol dispersion solution was coated at 3,000 rpm (ramp up time 3 sec, coating time 30 sec) and then baked at about 100° C. for about 10 minutes on the hotplate so as to be formed to a thickness of about 70 nm. Thereafter, Al was formed to a thickness of about 100 nm utilizing an evaporator. Thereafter, encapsulation was performed to prevent or substantially prevent moisture and oxygen from being penetrated by utilizing cover glass and a UV-curable epoxy sealant.

Table 1 below shows evaluation results of characteristics of the quantum dots according to Comparative Examples and Embodiments. Table 2 shows evaluation results of characteristics of the light emitting device including the quantum dots according to Comparative Examples and Embodiments. In Comparative Examples 1 and 2, each of the quantum dots includes two shell layers, and in Embodiments 1 and 2, each of the quantum dots includes three shell layers. The quantum dots and the light emitting devices according to Embodiments 1 and 2 are each according to an embodiment of the present disclosure.

In Table 1, the core of each of the quantum dots according to Comparative Example 1, Comparative Example 2, Embodiment 1, and Embodiment 2 has a diameter of about 3.2 nm. The "particle size" is a value expressed by summing the thicknesses of the shell layers and the diameter of the core of each of the quantum dots according to Comparative Example 1, Comparative Example 2, Embodiment 1, and Embodiment 2. Each of the quantum dots according to Comparative Example 1 and Embodiment 1 has a particle size of about 8 nm, and each of the quantum dots according to Comparative Example 2 and Embodiment 2 has a particle size of about 12 nm. A maximum emission wavelength λmax in an emission spectrum and a full width at half maximum (FWHM) in the emission spectrum measured in Comparative Examples and Embodiments were illustrated.

A value "LT50" in Table 2 shows a time that is taken to decrease the brightness of the light emitting device by half. Thus, a time that is taken to decrease the brightness of the light emitting device by utilizing 570 cd/m² as reference luminance was measured.

TABLE 1

| Classification | Particle size (nm) | Thickness (nm) of shell layer | λmax (nm) | Solution PLQY (%) | FWHM (nm) |
|---|---|---|---|---|---|
| Comparative Example 1 | 8.0 | First shell layer: 0.3 Second shell layer: 2.1 | 623 | 75 | 42 |
| Comparative Example 2 | 12.0 | First shell layer: 0.3 Second shell layer: 4.1 | 625 | 55 | 42 |
| Embodiment 1 | 8.0 | First shell layer: 0.6 Second shell layer: 0.3 Third shell layer: 1.5 | 625 | 85 | 40 |
| Embodiment 2 | 12.0 | First shell layer: 0.6 Second shell layer: 0.3 Third shell layer: 3.5 | 627 | 57 | 41 |

TABLE 2

| Classification | Film PLQY (%) | EQE (%) | LT50 (hr) |
|---|---|---|---|
| Comparative Example 1 | 30 | 1.8 | 80 |
| Comparative Example 2 | 23 | 0.7 | 70 |
| Embodiment 1 | 40 | 4.3 | 100 |
| Embodiment 2 | 45 | 8.1 | 120 |

Referring to Table 1, it is seen that each of the quantum dots according to Embodiments 1 and 2 has a FWHM less than that of each of the quantum dots according to Comparative Examples 1 and 2. When comparing values of the quantum yield (PLQY) of the quantum dots according to Comparative Example 1 and Embodiment 1 having the same particle size of about 8 nm, it is shown that the PLQY according to Embodiment 1 has a larger value. Thus, it is seen that luminous efficiency of the quantum dots according to Embodiment 1 is excellent. In addition, when comparing values of the PLQY of the quantum dots according to Comparative Example 2 and Embodiment 2 having the same particle size of about 12 nm, it is shown that the PLQY according to Embodiment 2 has a larger value. Thus, it is seen that luminous efficiency of the quantum dots according to Embodiment 2 is excellent.

Referring to Table 2, it is seen that the PLQY of each of the light emitting devices according to Embodiments 1 and 2 has a value greater than that of the PLQY of each of the light emitting devices according to Comparative Example 1 and Comparative Example 2. In addition, it is seen that external quantum efficiency (EQE) of each of the light emitting devices according to Embodiments 1 and 2 is greater than that of each of the light emitting devices according to Comparative Examples 1 and 2. Therefore, it is seen that the light emitting devices according to Embodiments 1 and 2, each of which includes the quantum dots according to an embodiment, have excellent efficiency characteristics when compared to the light emitting devices according to Comparative Examples 1 and 2.

In addition, when comparing the value of "LT50", each of the light emitting devices according to Embodiments 1 and 2 has a value greater than that of each of the light emitting devices according to Comparative Examples 1 and 2. Thus, when comparing the light emitting devices according to Comparative Examples 1 and 2, it is seen that each of the light emitting devices according to Embodiments 1 and 2 is improved in lifespan characteristic of the device.

In an embodiment, the quantum dot, which includes the core and the plurality of shell layers surrounding the core, and in which the band gap of the core is less than that of the outermost shell layer from among the plurality of shell layers, and the band gap of the outermost shell layer is less than that of the second (2nd) shell layer, may be provided. Also, in the quantum dot according to an embodiment, the band gap of the outermost shell layer may be less than that of the previous (e.g., inner) shell layer to improve charge injection characteristics.

In addition, the light emitting device according to an embodiment may include the plurality of quantum dots including the three or more shell layers, and thus, the distance between the cores of quantum dots adjacent to each other may increase to improve the lifespan and luminous efficiency of the device.

The quantum dot according to the embodiment may include the core and the N (e.g., 3 or more) shell layers, and the band gap of the N-th shell layer may be greater than that of the core and less than that of the second shell layer to facilitate the injection of the charges.

In addition, the light emitting device including the plurality of quantum dots, in which the distance between the cores increases, has improved light emitting efficiency and lifespan of the light emitting device.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

It will be apparent to those skilled in the art that various suitable modifications and deviations can be made in the present disclosure. Thus, it is intended that the present disclosure covers the modifications and deviations of this disclosure provided they come within the scope of the appended claims and their equivalents.

Accordingly, the technical scope of the present disclosure should not be limited to the contents described in the detailed description of the specification, but should be determined by the claims, and equivalents thereof.

What is claimed is:

1. A quantum dot comprising:
   a core; and
   N shell layers configured to sequentially surround the core,
   wherein band gaps of the core and the N shell layers satisfy Equation 1 below:

$$BG_0 < BG_N < BG_2 \qquad \text{Equation 1}$$

wherein, in Equation 1 above, $BG_0$ is the band gap of the core, $BG_2$ is the band gap of a second shell layer, $BG_N$ is the band gap of an N-th shell layer, and N is an integer of 3 or more.

2. The quantum dot of claim 1, wherein the band gap of the N-th shell layer is less than that of an (N−1)-th shell layer.

3. The quantum dot of claim 1, wherein the second shell layer has a smallest thickness from among thicknesses of the N shell layers.

4. The quantum dot of claim 1, wherein the N shell layers comprise:
   a first shell layer configured to surround the core;
   the second shell layer configured to surround the first shell layer; and
   a third shell layer configured to surround the second shell layer.

5. The quantum dot of claim 4, wherein the first shell layer comprises at least one of ZnSe, ZnS, ZnTe, GaP, GaSe, InSe, InS, AlP, AlSe, AlS, or GaN.

6. The quantum dot of claim 4, wherein the first shell layer and the third shell layer comprise the same material.

7. The quantum dot of claim 4, wherein
   the core comprises InP, the first shell layer comprises at least one of ZnSe or GaP, the second shell layer comprises at least one of ZnS or GaN, and the third shell layer comprises at least one of ZnSe or GaP, or
   the core comprises ZnSe, each of the first shell layer and the third shell layer comprises ZnSe, and the second shell layer comprises ZnS.

8. The quantum dot of claim 1, wherein the core comprises at least one of InP, ZnP, GaP, ZnSe, ZnTe, or AlP.

9. A quantum dot comprising:
   a core;
   a first shell layer configured to surround the core;
   a second shell layer configured to surround the first shell layer; and
   a third shell layer configured to surround the second shell layer,
   wherein the second shell layer has a band gap greater than that of each of the first shell layer and the third shell layer, and
   the second shell layer has a thickness less than that of each of the first shell layer and the third shell layer.

10. The quantum dot of claim 9, wherein the second shell layer is about 0.3 nm to about 2 nm in thickness.

11. The quantum dot of claim 9, wherein the first shell layer comprises at least one of ZnSe, ZnS, ZnTe, GaP, GaSe, InSe, InS, AlP, AlSe, AlS, or GaN.

12. The quantum dot of claim 9, wherein the first shell layer and the third shell layer comprise the same material.

13. The quantum dot of claim 9, wherein the core comprises at least one of InP, ZnP, GaP, ZnSe, ZnTe, or AlP.

14. The quantum dot of claim 9, further comprising a plurality of shell layers configured to surround the third shell layer,
    wherein each of the plurality of shell layers has a band gap less than that of the third shell layer.

15. A light emitting device comprising:
    a first electrode and a second electrode facing each other; and
    a light emitting layer between the first electrode and the second electrode and comprising a plurality of quantum dots,
    wherein the plurality of quantum dots comprises a first quantum dot and a second quantum dot, each of the first and second quantum dots comprises:
        a core;
        a first shell layer configured to surround the core;
        a second shell layer configured to surround the first shell layer; and
        a third shell layer configured to surround the second shell layer,
    wherein a band gap of the second shell layer is greater than a band gap of the first shell layer and is greater than a band gap of the third shell layer, and
    wherein a distance between the core of the first quantum dot and the core of the second quantum dot ranges from about 5 nm to about 15 nm.

16. The light emitting device of claim 15, wherein each of the first shell layer and the third shell layer has a thickness greater than that of the second shell layer.

17. The light emitting device of claim 15, wherein the first shell layer comprises at least one of ZnSe, ZnS, ZnTe, GaP, GaSe, InSe, InS, AlP, AlSe, AlS, or GaN.

18. The light emitting device of claim 15, wherein each of the first shell layer and the third shell layer comprises ZnSe.

19. The light emitting device of claim 15, wherein the core comprises at least one of InP, ZnP, GaP, ZnSe, ZnTe, or AlP.

20. The light emitting device of claim 15, further comprising a plurality of shell layers configured to surround the third shell layer,
    wherein each of the plurality of shell layers has a band gap less than that of the third shell layer.

21. The light emitting device of claim 15, further comprising an electron transport region and a hole transport region, the electron transport region and the hole transport region being between the first electrode and the second electrode,
    wherein the electron transport region is to transport an electrode to the third shell layer and/or the hole transport region is to transport a hole to the third shell layer.

* * * * *